United States Patent
Kwon

(10) Patent No.: US 9,806,207 B2
(45) Date of Patent: Oct. 31, 2017

(54) SOLAR CELL AND METHOD FOR MANUFACTURING SAME

(71) Applicant: LG INNOTEK CO., LTD., Seoul (KR)

(72) Inventor: Se Han Kwon, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 73 days.

(21) Appl. No.: 14/401,005

(22) PCT Filed: Jun. 5, 2013

(86) PCT No.: PCT/KR2013/004986
§ 371 (c)(1),
(2) Date: Nov. 13, 2014

(87) PCT Pub. No.: WO2013/183949
PCT Pub. Date: Dec. 12, 2013

(65) Prior Publication Data
US 2015/0144182 A1    May 28, 2015

(30) Foreign Application Priority Data
Jun. 5, 2012    (KR) .................. 10-2012-0060385

(51) Int. Cl.
*H01L 31/0216* (2014.01)
*H01L 31/032* (2006.01)
(Continued)

(52) U.S. Cl.
CPC .... *H01L 31/02167* (2013.01); *H01L 31/0322* (2013.01); *H01L 31/046* (2014.12);
(Continued)

(58) Field of Classification Search
CPC ................... H01L 31/0463–31/0468
See application file for complete search history.

(56) References Cited

U.S. PATENT DOCUMENTS 3,310,439 A * 3/1967 Seney ............... H01L 31/00
136/246
4,251,286 A * 2/1981 Barnett ............ H01L 31/03365
136/255
(Continued)

FOREIGN PATENT DOCUMENTS

JP    2002094089 A *  3/2002
JP    2004-186547 A   7/2004
(Continued)

OTHER PUBLICATIONS

Machine translation of JP2002-094089A.*
Search Report for International Application No. PCT/KR2013/004986.

*Primary Examiner* — Eric R Smith
(74) *Attorney, Agent, or Firm* — LRK Patent Law Firm

(57) ABSTRACT

A solar cell includes a support substrate, a back electrode layer on the support substrate, a light absorbing layer on the back electrode layer, a buffer layer on the light absorbing layer, a high resistance buffer layer on the buffer layer, and a front electrode layer on the high resistance buffer layer. An insulating part is located on a top surface of the light absorbing layer. A method of fabricating the solar cell includes forming the back electrode layer on the substrate, forming the light absorbing layer on the back electrode layer, forming the buffer layer on the light absorbing layer, oxidizing a top surface of the buffer layer, and forming the front electrode layer on the buffer layer.

9 Claims, 6 Drawing Sheets

(51) Int. Cl.
*H01L 31/046* (2014.01)
*H01L 31/0463* (2014.01)
*H01L 31/18* (2006.01)
*H01L 31/0749* (2012.01)
*H01L 31/20* (2006.01)

(52) U.S. Cl.
CPC ...... *H01L 31/0463* (2014.12); *H01L 31/0749* (2013.01); *H01L 31/18* (2013.01); *H01L 31/208* (2013.01); *Y02E 10/541* (2013.01); *Y02P 70/521* (2015.11)

(56) References Cited

U.S. PATENT DOCUMENTS

| | | | | |
|---|---|---|---|---|
| 4,544,797 | A * | 10/1985 | Hewig | H01L 31/02242 136/249 |
| 4,668,840 | A * | 5/1987 | Kiyama | H01L 31/202 136/244 |
| 4,697,041 | A * | 9/1987 | Okaniwa | H01L 31/02242 136/244 |
| 4,726,849 | A * | 2/1988 | Murata | H01L 31/03921 136/244 |
| 4,965,655 | A * | 10/1990 | Grimmer | H01L 31/02246 136/244 |
| 5,277,786 | A * | 1/1994 | Kawakami | H01L 31/186 136/258 |
| 5,626,688 | A * | 5/1997 | Probst | H01L 31/0322 136/264 |
| 6,215,061 | B1 * | 4/2001 | Kariya | H01L 31/02363 136/256 |
| 2005/0284517 | A1 * | 12/2005 | Shinohara | H01L 31/076 136/256 |
| 2008/0115827 | A1 * | 5/2008 | Woods | H01L 31/0392 136/255 |
| 2009/0283131 | A1 * | 11/2009 | Kushiya | H01L 31/02242 136/244 |
| 2010/0178716 | A1 * | 7/2010 | Zapalac | H01L 31/0392 438/4 |
| 2011/0011451 | A1 * | 1/2011 | Hakuma | H01L 31/02248 136/255 |
| 2011/0024880 | A1 | 2/2011 | Li et al. | |
| 2011/0303272 | A1 * | 12/2011 | Nishi | H01L 31/075 136/255 |
| 2012/0199191 | A1 * | 8/2012 | Lim | H01L 31/03923 136/256 |
| 2012/0309125 | A1 * | 12/2012 | Aksu | H01L 31/0322 438/57 |
| 2013/0000722 | A1 * | 1/2013 | Yamada | H01L 31/02363 136/256 |

FOREIGN PATENT DOCUMENTS

| | | | |
|---|---|---|---|
| KR | 10-2011-0047726 A | 5/2011 | |
| KR | WO 2011053077 A2 * | 5/2011 | ....... H01L 31/03923 |
| KR | 10-2011-0097256 A | 8/2011 | |

* cited by examiner

[Figure 1]
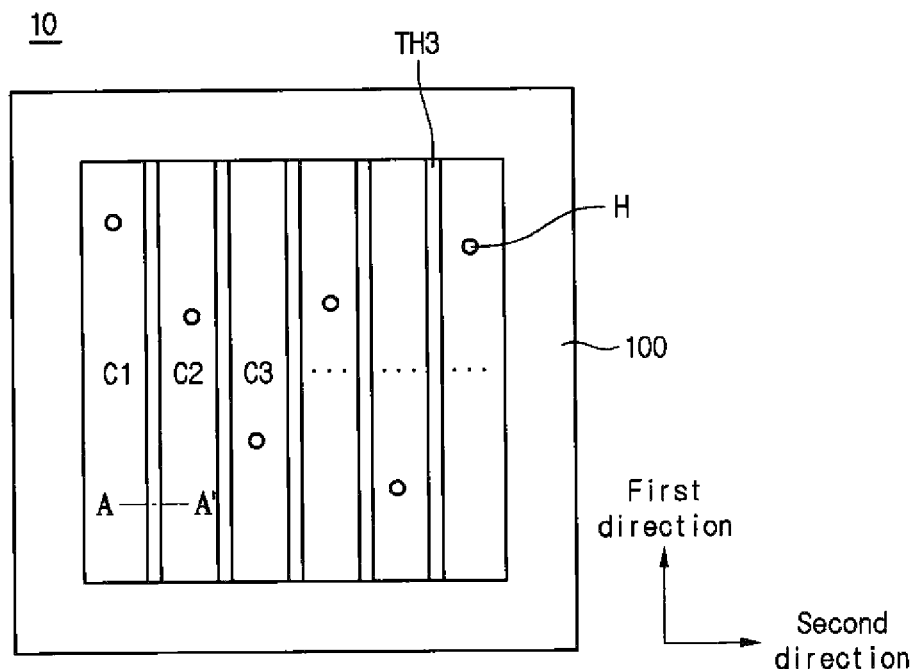
[Figure 2]
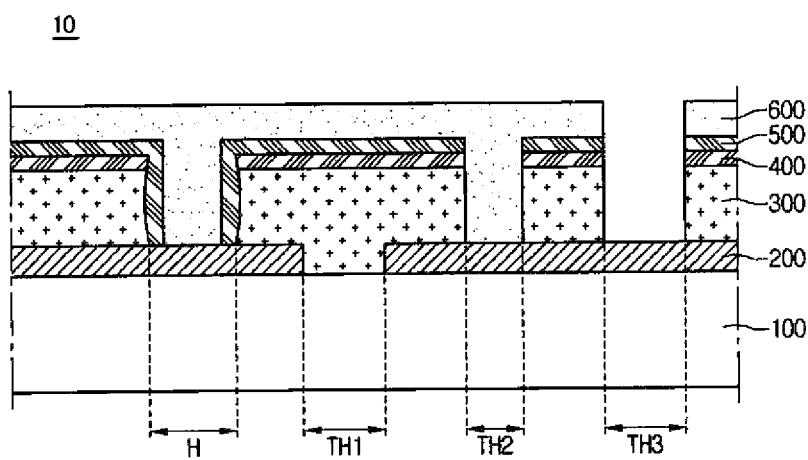

[Figure 3]
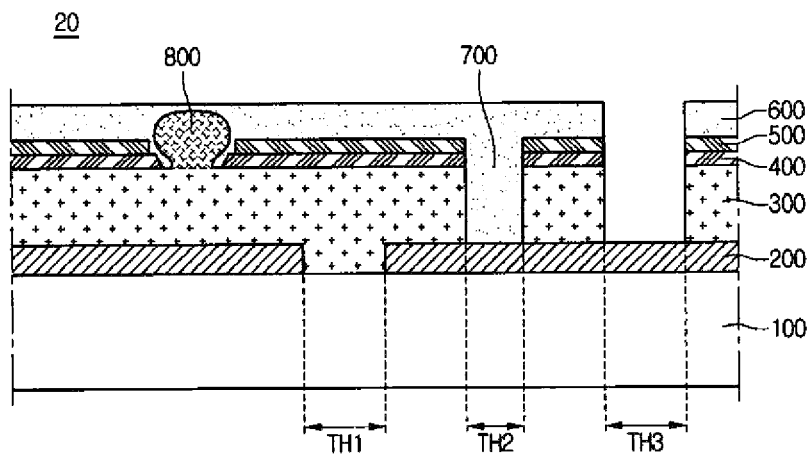
[Figure 4]
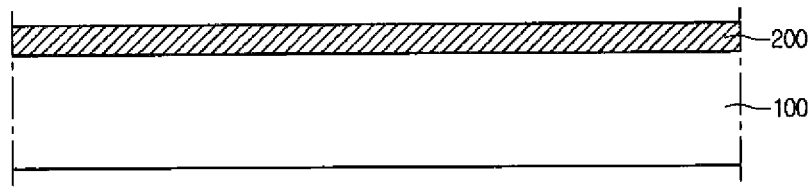
[Figure 5]
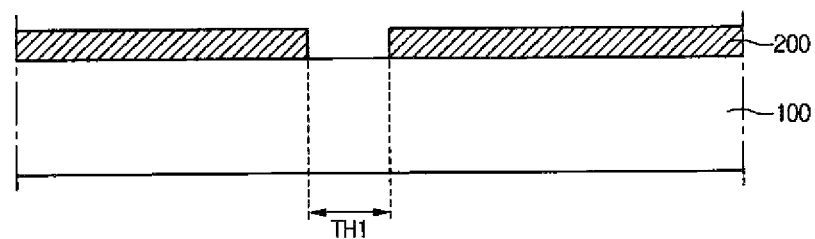

[Figure 6]
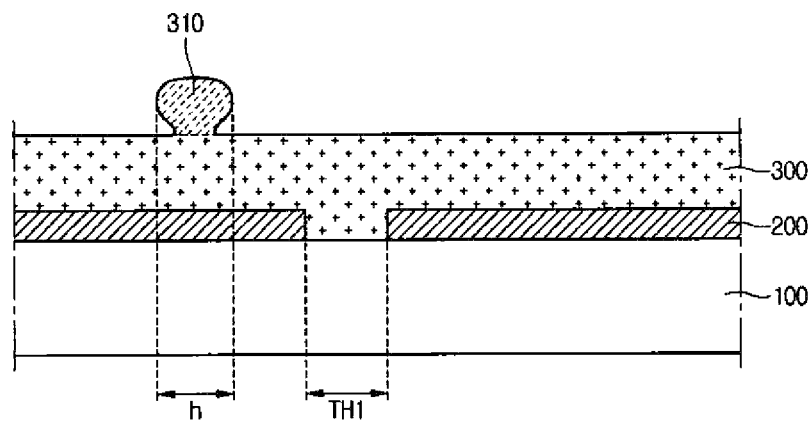
[Figure 7]
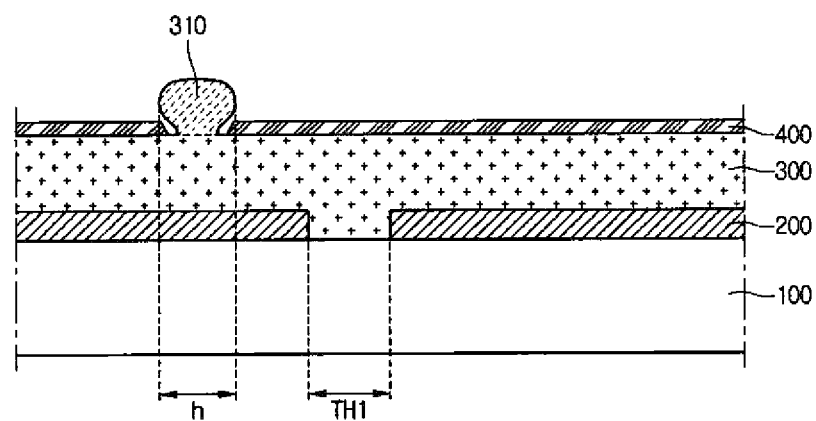

[Figure 8]
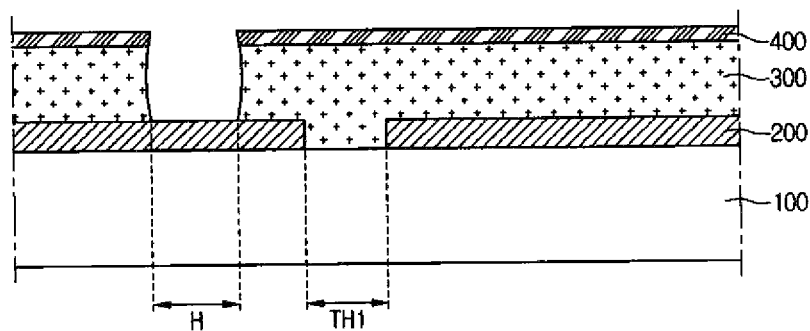
[Figure 9]
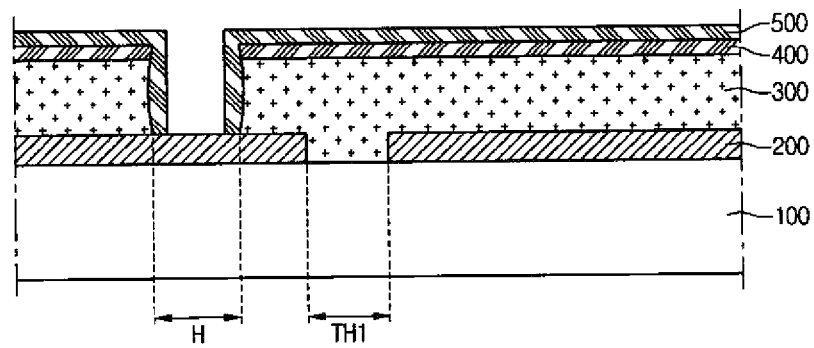
[Figure 10]
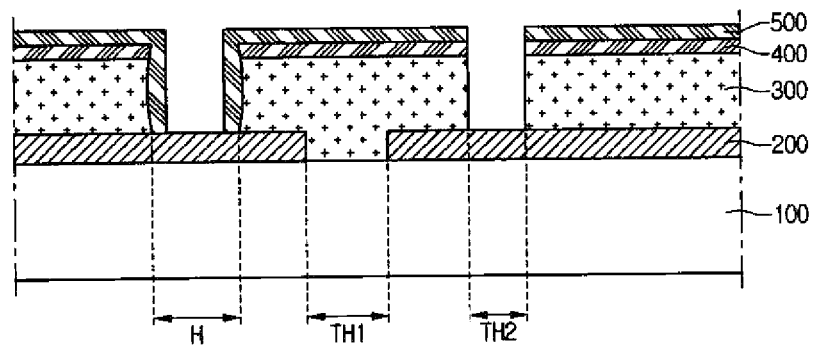

[Figure 11]
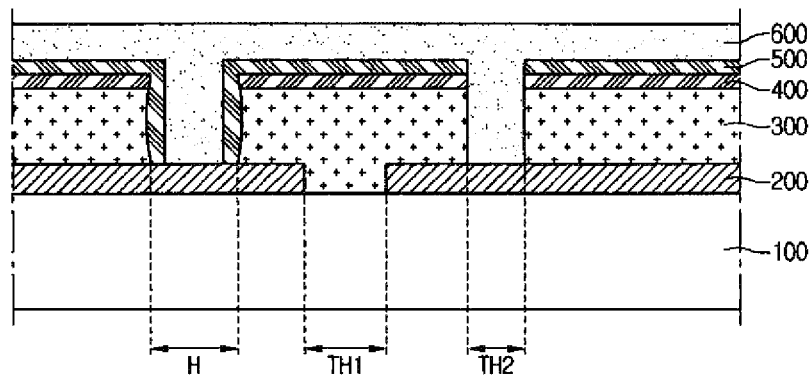
[Figure 12]
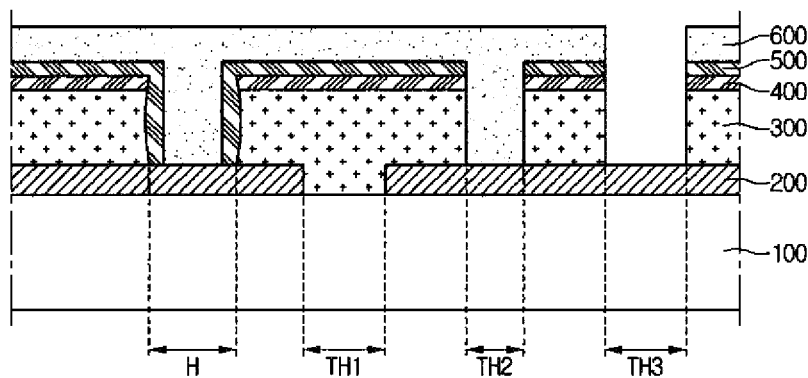

[Figure 13]
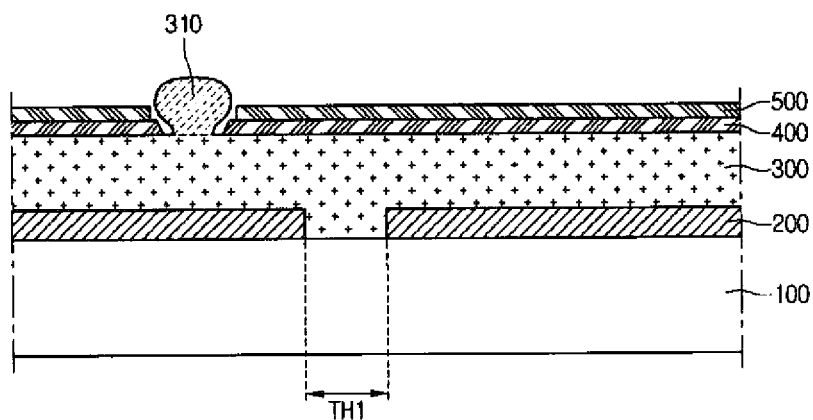
[Figure 14]
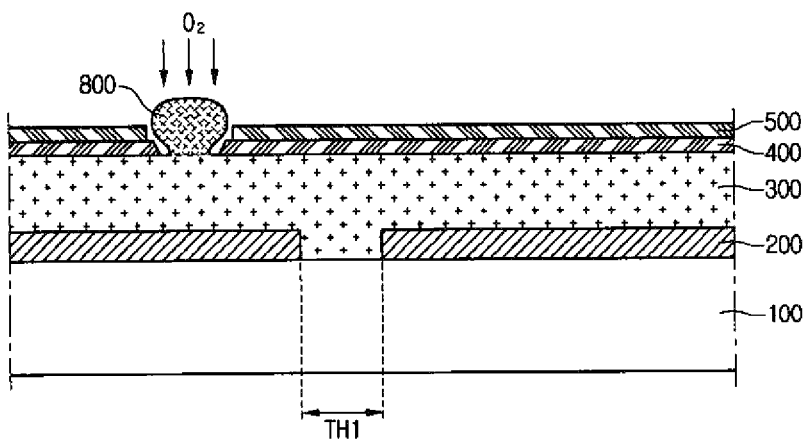

SOLAR CELL AND METHOD FOR MANUFACTURING SAME

TECHNICAL FIELD

The embodiment relates to a solar cell and a method of fabricating the same.

BACKGROUND ART

A method of fabricating a solar cell for solar light power generation is as follows. First, after preparing a substrate, a back electrode layer is formed on the substrate and patterned by a laser, thereby forming a plurality of back electrodes.

Thereafter, a light absorbing layer, a buffer layer, and a high resistance buffer layer are sequentially formed on the back electrodes. Various schemes including a scheme of forming light absorbing layer by simultaneously or separately evaporating copper (Cu), indium (In), gallium (Ga), and selenium (Se) have been used in order to form the light absorbing layer.

Then, a buffer layer including cadmium sulfide (CdS) is formed on the light absorbing layer through a sputtering process. After that, a high resistance buffer layer including zinc oxide (ZnO) is formed on the buffer layer through the sputtering process. Subsequently, groove patterns may be formed on the light absorbing layer, the buffer layer, and the high resistance buffer layer.

Subsequently, a transparent conductive material is laminated on the high resistance buffer layer, and is filled in the groove pattern. Next, the groove pattern may be formed on the transparent electrode layer, so that a plurality of solar cells may be formed. The transparent electrodes and the back electrodes are misaligned with respect to each other, and electrically connected to each other through connection wires. Therefore, the solar cells may be electrically connected to each other in series.

As described above, in order to convert the solar light into electrical energy, various solar cell apparatuses have been fabricated for the use thereof. One of the solar cell apparatuses is disclosed in Korean Unexamined Patent Publication No. 10-2008-0088744.

Meanwhile, as foreign matters such as particles or second phases are formed in the process of depositing the light absorbing layer or dropped on the light absorbing layer after the light absorbing layer has been deposited, the buffer layer may not be smoothly deposited thereafter. Accordingly, a shunt circuit is made due to the short between the light absorbing layer and the front electrode layer, and efficiency is degraded.

DISCLOSURE

Technical Problem

The embodiment provides a solar cell having improved reliability.

Technical Solution

According to the embodiment, there is provided a solar cell including a support substrate, a back electrode layer on the support substrate, a light absorbing layer on the back electrode layer, a buffer layer on the light absorbing layer, a high resistance buffer layer on the buffer layer, and a front electrode layer on the high resistance buffer layer. An insulating part is located on a top surface of the light absorbing layer.

According to the embodiment, there is provided a method of fabricating a solar cell. The method includes forming a back electrode layer on a substrate, forming a light absorbing layer on the back electrode layer, forming a buffer layer on the light absorbing layer, oxidizing a top surface of the buffer layer, and forming a front electrode layer on the buffer layer.

Advantageous Effects

As described above, the solar cell according to the first embodiment includes the hole formed through the light absorbing layer and the buffer layer. The hole is formed through the etching process. In detail, the hole is formed by etching an area having the foreign matters such as particles or second phases formed in the process of depositing the light absorbing layer or dropped on the light absorbing layer after the light absorbing layer has been deposited.

Accordingly, the buffer layer or the high resistance buffer layer can be smoothly deposited on the light absorbing layer against the foreign matters. In addition, the shunt circuit, which is made due to the short between the light absorbing layer and the front electrode layer as the buffer layer or the high resistance buffer layer is not smoothly deposited, can be prevented and the degradation in the solar cell efficiency can be prevented.

Meanwhile, since the hole is formed through an etch process after the buffer layer has been deposited, the surface of the light absorbing layer can be prevented from being damaged by an etchant. Therefore, the light efficiency can be improved, and the reliability of the solar cell can be improved.

The solar cell according to the second embodiment includes the insulating part positioned on the light absorbing layer. The shunt circuit, which is made due to the short between the light absorbing layer and the front electrode layer resulting from the particle or the secondary phase, can be prevented by the insulating part, and the degradation in the solar cell efficiency can be prevented. In other words, the light absorbing layer can be insulated from the front electrode layer by the insulating part.

DESCRIPTION OF DRAWINGS

FIG. 1 is a plan view showing a solar cell according to the first embodiment.

FIG. 2 is a sectional view taken along line A-A' of FIG. 1.

FIG. 3 is a sectional view showing a solar cell according to the second embodiment.

FIGS. 4 to 12 are sectional views showing the fabricating procedure of the solar cell according to the first embodiment.

FIGS. 13 to 14 are sectional views showing the fabricating procedure of the solar cell according to the second embodiment.

BEST MODE

Mode for Invention

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer (or film), each region, each pattern, or each structure shown in the drawings may be exaggerated, omitted or schematically drawn for the purpose of convenience or clarity. In addition, the size of elements does not utterly reflect an actual size.

Hereinafter, the embodiments of the present invention will be described in detail with reference to accompanying drawings.

First, the solar cell according to the first embodiment will be described in detail with reference to FIGS. 1 and 2.

FIG. 1 is a plan view showing a solar cell according to the first embodiment. FIG. 2 is a sectional view taken along line A-A' of FIG. 1.

Referring to FIGS. 1 and 2, the solar cell according to the first embodiment includes a support substrate 100, a back electrode layer 200, a light absorbing layer 300, a buffer layer 400, a hole H, a high resistance buffer layer 500, and a front electrode layer 600.

The support substrate 100 has a plate shape, and supports the back electrode layer 200, the light absorbing layer 300, the buffer layer 400, the high resistance buffer layer 500, and the front electrode layer 600.

The support substrate 100 may include an insulator. The support substrate 100 may be a glass substrate, a plastic substrate, or a metal substrate. Meanwhile, the support substrate 100 may include soda lime glass. The support substrate 100 may be transparent, flexible or rigid.

The back electrode layer 200 is provided on the support substrate 100. The back electrode layer 200 is a conductive layer. For example, the back electrode layer 200 may include metal such as molybdenum (Mo).

In addition, the back electrode layer 200 may include at least two layers. In this case, the layers may include the same metal or mutually different metals.

The back electrode layer 200 is formed therein with first through holes TH1. The first through holes TH1 are open regions to expose the top surface of the support substrate 100. When viewed in a plan view, the first through holes TH1 may have the shape extending in one direction.

Each of the first through holes TH1 may have the width in the range of about 80 µm to about 200 µm. The back electrode layer 200 is divided into a plurality of back electrodes and tow connection electrodes by the first through holes TH1

The back electrodes are spaced apart from each other by the first through holes TH1. The back electrodes are arranged in the shape of a stripe.

Alternatively, the back electrodes may be arranged in the shape of a matrix. In this case, when viewed in a plan view, the first through holes TH1 may be provided in the shape of a lattice.

The light absorbing layer 300 is provided on the back electrode layer 200. Further, the first through holes TH1 are filled with the material included in the light absorbing layer 300.

The light absorbing layer 300 includes group I-III-VI compounds. For instance, the light absorbing layer 300 may include the Cu (In,Ga)Se$_2$ (CIGS) crystal structure, the Cu(In)Se$_2$ crystal structure, or the Cu(Ga)Se$_2$ crystal structure.

The light absorbing layer 300 may have an energy bandgap in the range of 1 eV to 1.8 eV.

The buffer layer 400 is provided on the light absorbing layer 300. The buffer layer 400 directly makes contact with the light absorbing layer 300.

The buffer layer 400 includes cadmium sulfide (CdS), and the energy bandgap of the buffer layer 400 is in the range of about 2.2 eV to 2.4 eV.

The hole H is formed in the light absorbing layer 300 and the buffer layer 400. The hole H is formed through the light absorbing layer 300 and the buffer layer 400.

The hole H has the shape of a dot. Accordingly, referring to FIG. 1, the hole H is distinguished from the through holes TH1, second through holes TH2, and third through holes TH3 extending in one direction.

The high resistance buffer layer 500 and the front electrode layer 600 may be positioned in the hole H.

The hole H is formed through an etch process. In detail, the hole H is formed by etching a portion of the light absorbing layer 300 having foreign matters such as particles or second phases formed in the process of depositing the light absorbing layer or dropped on the light absorbing layer after the light absorbing layer has been deposited.

Accordingly, a problem that the buffer layer 400 or the high resistance buffer layer 500 are not smoothly deposited on the light absorbing layer 300 due to the foreign matters can be solved. In addition, the shunt circuit, which is made due to the short between the light absorbing layer 300 and the front electrode layer 600 as the buffer layer 400 or the high resistance buffer layer 500 is not smoothly deposited, can be prevented and the degradation in the solar cell efficiency can be prevented.

Meanwhile, since the hole H is formed through an etch process after the buffer layer 400 has been deposited, the surface of the light absorbing layer 300 can be prevented from being damaged by an etchant. Therefore, the light efficiency can be improved, and the reliability of the solar cell can be improved.

The high resistance buffer layer 500 is disposed on the buffer layer 400. In addition, the high resistance buffer layer 500 may be positioned in the hole H.

The high resistance buffer layer 500 includes zinc oxide (i-ZnO) which is not doped with impurities. The energy bandgap of the high resistance buffer layer 500 may be in the range of about 3.1 eV to about 3.3 eV.

Second through holes TH2 are formed in the light absorbing layer 300, the buffer layer 400, and the resistance buffer layer 500. The second through holes TH2 are formed through the light absorbing layer 300. The second through holes TH2 are open regions to expose the top surface of the back electrode layer 200.

The second through holes TH2 are formed adjacent to the first through holes TH1. In other words, when viewed in a plan view, portions of the second through holes TH2 are formed beside the first through holes TH1.

The width of the second through holes TH2 may be in the range of about 80 µm to about 200 µm.

In addition, a plurality of light absorbing parts are defined in the light absorbing layer 300 by the second through holes TH2. In other words, the light absorbing layer 300 is divided into the light absorbing parts by the second through holes TH2.

The buffer layer 400 is divided into a plurality of buffers by the second through holes TH2. Similarly, the high resistance buffer layer 500 is divided into a plurality of high resistance buffers by the second through holes TH2.

The front electrode layer 600 is provided on the high resistance buffer layer 500. The front electrode layer 600 may be positioned in the hole H.

The front electrode layer 600 is transparent and includes a conductive layer. In addition, the resistance of the front electrode layer 600 is higher than that of the back electrode layer 200. For example, the resistance of the front electrode layer 600 is about 10 times to 200 times higher than that of the back electrode layer 200.

The front electrode layer 600 includes oxide. For example, a material constituting the front electrode layer 600 may include zinc oxide (ZO), indium tin oxide (ITO), or indium zinc oxide (IZO).

In addition, the oxide may include conductive impurities such as aluminum, alumina (Al2O3), magnesium (Mg) or gallium (Ga). In more detail, the front electrode layer 600 may include Al doped zinc oxide (AZO) or Ga doped zinc oxide (GZO). The thickness of the front electrode layer 600 may be in the range of about 800 nm to about 1200 nm.

The third through holes TH3 are formed in the light absorbing layer 300, the buffer layer 400, the high resistance buffer layer 500 and the front electrode layer 600. The third through holes TH3 are open regions to expose the top surface of the back electrode layer 200. For example, the width of the third through holes TH3 may be in the range of about 80 μm to about 200 μm.

The second through holes TH2 are formed adjacent to the second through holes TH2. In more detail, the third through holes TH3 are provided beside the second through holes TH2. In other words, when viewed in a plan view, the third through holes TH3 are formed beside the second through holes TH2 in parallel to the second through holes TH2.

The front electrode layer 600 is divided into a plurality of front electrodes by the third through holes TH3. In other words, the front electrodes are defined by the third through holes TH3.

The front electrodes have the shape corresponding to that of the back electrodes 230. In other words, the front electrodes are arranged in the shape of a stripe. Differently, the front electrodes may be arranged in the form of a matrix.

The front electrode layer 600 includes a plurality of connection parts 700 formed by filling a transparent conductive material in the second through holes TH2.

A plurality of first to third cells C1, C2, and C3 are defined by the third through holes TH3. In more detail, the first cell C1, the second cell C2, and the third cell C3 are defined by the second through holes TH2 and the third through holes TH3. In other words, the solar cell apparatus according to the embodiment includes the first cell C1, the second cell C2, and the third cell C3 provided on the support substrate 100.

The third cells C3 are interposed between the first cell C1 and the second cell C2. The first cell C1, the second cell C2, and the third cell C3 are connected to each other in series.

The connection parts 700 are provided in the second through holes TH2. The connection parts 700 extend downward from the front electrode layer 600 so that the connection parts 700 are connected with the back electrode layer 200.

Accordingly, the connection parts 700 connect mutually adjacent cells to each other. In other words, the connection parts 700 connect windows and back electrodes included in the adjacent cells, respectively, to each other.

Outer portions of the light absorbing layer 300, the buffer layer 400, the high resistance buffer layer 500 and the front electrode layer 600 may be substantially aligned in line with each other. In other words, the light absorbing layer 300, the buffer layer 400, the high resistance buffer layer 500 and the front electrode layer 600 may correspond to each other.

Hereinafter, a solar cell according to the second embodiment will be described with reference to FIG. 3. For the clear and brief explanation, the structure and the components the same as or similar to those of the first embodiment will not be further described.

Referring to FIG. 3, the solar cell according to the second embodiment includes the support substrate 100, the back electrode layer 200, the light absorbing layer 300, the buffer layer 400, an insulating part 800, the high resistance buffer layer 500, and the front electrode layer 600.

The insulating part 800 is located on a top surface of the light absorbing layer 300. The insulating part 800 includes an oxide. The insulating part 800 is formed through an oxidation process. In detail, the insulating part 800 is formed by oxidizing particles or second phases formed in the process of depositing the light absorbing layer 300 or dropped on the light absorbing layer 300 after the light absorbing layer 300 has been deposited. In other words, the insulating part 800 includes an oxide of the foreign matters.

The insulating part 800 has the shape of a dot.

The shunt circuit, which is made due to the short occurring between the light absorbing layer 300 and the front electrode layer 600 by the particles or the secondary phases, can be prevented through the insulating part 800, and the solar cell efficiency can be prevented from being degraded. In other words, the light absorbing layer 300 can be insulated from the front electrode layer 600 through the insulating part 800.

Meanwhile, the front electrode layer 600 may cover the insulating part 800.

Hereinafter, a method of fabricating the solar cell according to the first embodiment will be described with reference to FIGS. 4 to 12.

FIGS. 4 to 12 are sectional views showing the fabricating procedure of the solar cell according to the first embodiment.

First, referring to FIG. 4, metal such as molybdenum (Mo) is deposited on the support substrate 100 through a sputtering process to form the back electrode layer 200. The back electrode layer 200 may be formed through two processes having process conditions different from each other.

An additional layer such as an anti-diffusion layer may be interposed between the support substrate 100 and the back electrode layer 200.

Referring to FIG. 5, the first through holes TH1 are formed by patterning the back electrode layer 200. Accordingly, a plurality of back electrodes are formed on the support substrate 100. The back electrode layer 200 is patterned by a laser.

The first through holes TH1 may expose the top surface of the support plate 100, and may have the width of about 80 μm to about 200 μm.

An additional layer such as an anti-diffusion layer may be interposed between the support substrate 100 and the back electrode layer 200. In this case, the first through holes TH1 expose the top surface of the additional layer.

Referring to FIG. 6, the light absorbing layer 300 is formed on the back electrode layer 200. The light absorbing layer 300 may be formed through the sputtering process or the evaporation scheme.

The light absorbing layer 300 is formed by extensively using various schemes including a scheme of forming a Cu(In,Ga)Se$_2$ (CIGS) based-light absorbing layer 300 by simultaneously or separately evaporating Cu, In, Ga, and Se and a scheme of performing a selenization process after a metallic precursor film has been formed.

Regarding the details of the selenization process after the formation of the metallic precursor layer, the metallic precursor layer is formed on the back contact electrode 200 through a sputtering process employing a Cu target, an In target, or a Ga target.

Thereafter, the metallic precursor layer is subject to the selenization process so that the $Cu(In,Ga)Se_2$ (CIGS) based-light absorbing layer 300 is formed.

In addition, the sputtering process employing the Cu target, the In target, and the Ga target and the selenization process may be simultaneously performed.

In addition, a CIS or a CIG light absorbing layer 300 may be formed through a sputtering process employing only Cu and In targets or only Cu and Ga targets and the selenization process.

In this case, foreign matters 310 such as particles or secondary phases may be formed. Therefore, the light absorbing layer 300 may include a particle forming part h including the foreign matters 310. When the buffer layer 400, the high resistance buffer layer 500, and the front electrode layer 600 are formed without removing the foreign matters 310, the buffer layer 400 and the high resistance buffer layer 500 are not smoothly formed on the particle forming part h, so that the short between the front electrode layer 600 and the light absorbing layer 300 may occur.

Thereafter, the buffer layer 400 is formed on the light absorbing layer 300. The CdS is deposited through a sputtering process or a chemical bath deposition (CBD), and the buffer layer 400 is formed.

Referring to FIG. 8, a portion of the buffer layer 400 may be etched. In detail, the hole H may be formed by etching portions of the buffer layer 400 and the light absorbing layer 300. In other words, the particle forming part h, in which the foreign matters 310 are positioned, may be formed through an etch process. Accordingly, the foreign matters 310 may be removed.

In this case, an etchant including potassium cyanide (KCN) may be used.

The hole H may be formed through the light absorbing layer 300 and the buffer layer 400 in the etching step. The hole H corresponds to the foreign matters h.

The etching step is performed after the buffer layer 400 has been formed, so that the surface of the light absorbing layer 300 is not exposed to the etchant. Accordingly, the light absorbing layer 300 may be prevented from being damaged by the etchant. Accordingly, the final light efficiency can be improved, and the reliability of the solar cell can be improved.

Thereafter, referring to FIG. 9, zinc oxide is deposited on the buffer layer 400 through a sputtering process to form the high resistance buffer layer 500.

The buffer layer 400 and the high resistance buffer layer 500 are deposited at a thin thickness. For example, the buffer layer 400 and the high resistance buffer layer 500 may have the thickness in the range of about 1 nm to about 80 nm.

Referring to FIG. 10, the second through holes TH2 are formed by removing portions of the light absorbing layer 300, the buffer layer 400, and the high resistance buffer layer 500.

The second through holes TH2 may be formed by a mechanical device such as a tip or a laser device.

For example, the light absorbing layer 300 and the buffer layer 400 may be patterned by the tip having the width in the range of about 40 μm to about 180 μm. The second through holes TH2 may be formed by a laser having the wavelength in the range of about 200 nm to about 600 nm.

In this case, the second through holes TH2 may have a width in the range of about 100 μm to about 200 μm. The second through holes TH2 expose a portion of the top surface of the back electrode layer 200.

Referring to FIG. 11, the front electrode layer 600 is formed on the high resistance buffer layer 500. In order to form the front electrode layer 600, a transparent conductive material is laminated on the high resistance buffer layer 500. For example, the transparent conductive material may include zinc oxide doped with aluminum (Al).

In this case, the front electrode layer 600 may be formed in the hole H.

Referring to FIG. 12, the third through holes TH3 are formed by removing portions of the light absorbing layer 300, the buffer layer 400, the high resistance buffer layer 500, and the front electrode layer 600. Accordingly, a plurality of windows, and the first cell C1, the second cell C2, and the third cells C3 are defined by patterning the front electrode layer 600. Each third through hole TH3 may have the width in the range of about 80 μm to about 200 μm Hereinafter, a method of fabricating the solar cell according to the second embodiment will be described with reference to FIGS. 13 and 14.

FIGS. 13 and 14 are sectional views showing the fabricating procedure of the solar cell according to the second embodiment.

The method of fabricating the solar cell according to the second embodiment have the same process steps as those of the first embodiment until the process step shown in FIG. 7, that is, the step of forming the buffer layer 400 in the method of fabricating the solar cell according to the first embodiment.

Thereafter, referring to FIG. 13, the high resistance buffer layer 500 is formed on the buffer layer 400. In this case, the buffer layer 400 and the high resistance buffer layer 500 are not smoothly deposited in a part in which the foreign matters 310 are formed.

Subsequently, referring to FIG. 14, the top surface of the buffer layer 400 may be oxidized. In detail, in the step of oxidizing the top surface of the buffer layer 400, the surface of the foreign matters 310 may be oxidized. In the step of oxidizing the surface of the foreign matters 310, an oxygen plasma scheme may be used.

The foreign matters 310 are oxidized to form the insulating part 800. The short between the light absorbing layer 300 and the front electrode layer 600 may be prevented due to the insulating part 800.

Although accompanying drawings show that the foreign matters are oxidized after forming the high resistance buffer layer 500, the embodiment is not limited thereto. Therefore, after forming the buffer layer 400, foreign matters may be oxidized and then the high resistance buffer layer 500 may be formed.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A solar cell comprising:
   a support substrate;
   a back electrode layer on the support substrate;
   a light absorbing layer on the back electrode layer;
   a buffer layer on the light absorbing layer;
   a high resistance buffer layer on the buffer layer;
   a front electrode layer on the high resistance buffer layer,
   a plurality of first through holes which are formed directly on a top surface of the support substrate and extend through the back electrode layer, and define a plurality of back electrodes;
   a plurality of second through holes which are formed directly on a top surface of the back electrode layer and extend through the light absorbing layer, the buffer layer and the high resistance buffer layer, and define a plurality of light absorbing parts; and
   a plurality of third through holes which are formed directly on the top surface of the back electrode layer and extend through the light absorbing layer, the buffer layer, the high resistance buffer layer and the front electrode layer, and define a plurality of front electrodes,
   wherein the front electrode layer includes a plurality of connection parts formed by filling a transparent conductive material in the second through holes,
   wherein an insulating part is formed directly on a top surface of the light absorbing layer and extends through the buffer layer and the high resistance buffer layer,
   wherein the insulating part is spaced apart from the back electrode layer,
   wherein the front electrode layer covers the insulating part,
   wherein the front electrode layer makes contact with the insulating part, and
   wherein the front electrodes are arranged in a shape of a stripe or a lattice.

2. The solar cell of claim 1, wherein the insulating part includes an oxide.

3. The solar cell of claim 1, wherein the insulating part has a shape of a dot.

4. The solar cell of claim 1, wherein the back electrode layer includes at least two different layers.

5. The solar cell of claim 1, further comprising an anti-diffusion layer interposed between the support substrate and the back electrode layer.

6. The solar cell of claim 1, wherein the back electrodes are arranged in a shape of a stripe or a lattice.

7. The solar cell of claim 1, wherein the connection parts are integrated with the front electrode layer.

8. The solar cell of claim 1, wherein the insulating part is formed by oxidizing particles formed in a process of depositing the light absorbing layer or dropped on the light absorbing layer after the light absorbing layer has been deposited.

9. A solar cell comprising:
   a support substrate;
   a back electrode layer on the support substrate;
   a light absorbing layer on the back electrode layer;
   a buffer layer on the light absorbing layer;
   a high resistance buffer layer on the buffer layer;
   a front electrode layer on the high resistance buffer layer;
   a plurality of first through holes which are formed directly on a top surface of the support substrate and define a plurality of back electrodes;
   a plurality of second through holes which are formed directly on a top surface of the back electrode layer and extend through the light absorbing layer, the buffer layer and the high resistance buffer layer, and define a plurality of light absorbing parts; and
   a plurality of third through holes which are formed directly on the top surface of the back electrode layer and extend through the light absorbing layer, the buffer layer, the high resistance buffer layer and the front electrode layer, and define a plurality of front electrodes,
   wherein a plurality of pin holes are formed directly on the back electrode layer and extend through the light absorbing layer and the buffer layer, and
   wherein each of the plurality of pin holes has a shape of a dot,
   wherein the high resistance buffer layer and the front electrode layer are positioned in the pin hole, and
   wherein the high resistance buffer layer positioned in the pin hole makes contact with each side surface of the buffer layer and the light absorbing layer.

* * * * *